United States Patent [19]
Chien et al.

[11] Patent Number: 6,080,619
[45] Date of Patent: Jun. 27, 2000

[54] METHOD FOR MANUFACTURING DRAM CAPACITOR

[75] Inventors: Sun-Chieh Chien, Hsinchu; King-Lung Wu, Tainan Hsien; Chuan-Fu Wang, Taipei Hsien; Jason Jenq, Pingtung, all of Taiwan

[73] Assignee: United Microelectronics Corp., Hsinchu, Taiwan

[21] Appl. No.: 09/085,903

[22] Filed: May 27, 1998

[30] Foreign Application Priority Data

Apr. 23, 1998 [TW] Taiwan ................................. 87106239

[51] Int. Cl.$^7$ ................................................ H01L 21/8242
[52] U.S. Cl. ............................ 438/253; 438/255; 438/254
[58] Field of Search .................................... 438/250–256, 438/381, 393–399

[56] References Cited

U.S. PATENT DOCUMENTS 5,946,571   8/1999   Hsue et al. ............................. 438/255

*Primary Examiner*—Jey Tsai
*Attorney, Agent, or Firm*—Thomas, Kayden, Horstemeyer & Risley

[57] ABSTRACT

A method for manufacturing a DRAM capacitor is provided to form a lower electrode with a cylindrical profile by using a first stage and a second stage. The stages provide different etching rates in various situations. The invention uses the stages to allow the part of the second polysilicon layer between the capacitors to be completely etched and prevent the other part of the second polysilicon layer serving as a lower electrode from over-etching. The invention provides an easier process of forming a cylindrical capacitor with a larger surface.

11 Claims, 9 Drawing Sheets

METHOD FOR MANUFACTURING DRAM CAPACITOR

CROSS-REFERENCE TO RELATED APPLICATION

This application claims the priority benefit of Taiwan application Ser. No. 87106239, filed Apr. 23, 1998, the full disclosure of which is incorporated herein by reference.

BACKGROUND OF THE INVENTION

1. Field of the Invention

The invention relates in general to a method for manufacturing dynamic random access memory (DRAM), and more particularly to the manufacturing of a DRAM capacitor that has a larger electrode surface area for increasing the memory storage capacity of a DRAM.

2. Description of the Related Art

As microprocessors become more powerful and the amount of software data that need to be processed becomes very large, the amount of memory necessary for storing data becomes great. FIG. 1 is a circuit diagram showing a DRAM memory cell. A DRAM memory cell comprises a pass transistor 10 and a storage capacitor 11. The source terminal of the pass transistor 10 connects to a bit line 12, the gate terminal connects to a word line 13, and the drain terminal connects to the storage electrode, known also as the lower electrode 14, of a storage capacitor 11. The plate electrode 15, also known as an upper electrode or a cell plate, connects to a fixed voltage source. Between the storage electrode 14 and the plate electrode is a dielectric thin film 16.

A capacitor is the "heart" of a DRAM storage device. When the capacitor is capable of storing a large amount of electric charges, soft errors produced by α-particles can be greatly lowered. Furthermore, a large charge storage capacity in a DRAM capacitor can lower its refreshing frequency. In general, the methods of increasing the charge storage capacity in a capacitor include: (1) increasing the dielectric constant f of the dielectric layer so that the amount of charges stored in unit area of the capacitor is also increased; (2) reducing the thickness of the dielectric layer, however, there is a minimum thickness for any dielectric material, under which the quality of the dielectric layer formed will be compromised; (3) increasing the electrode surface area of a capacitor so that more electric charges can be stored in the same capacitor, however, increasing the electrode surface area will cause a lowering of the level of integration for DRAMs.

A conventional two-dimensional or a planar type of capacitor is fabricated in an integrated circuit with a small charge storage capacity. However, a planar type capacitor occupies a rather large surface area on the semiconductor substrate surface, and hence it is not suitable for high level of integration. Therefore, three-dimensional capacitors, for example, the so-called stacked type or trench type capacitors, are used for increasing the level of integration of DRAMs. Nowadays, even the simple three-dimensional capacitor design is insufficient and cannot provide the necessary capacitance. Consequently, methods of producing DRAM capacitors that can increase the surface area of its electrode within a given substrate area are still being developed.

FIG. 2A–2D are cross-sectional views showing the progression of manufacturing steps in the fabrication of a trench-type DRAM capacitor according to a conventional method. First, as shown in FIG. 2A, a substrate 200 having a field oxide layer 201, gate 202, exposed source/drain regions 203, 204 and 205, and an insulating layer 206 that covers the gate 202 already formed thereon, is provided. Next, a first polysilicon layer is formed over the substrate 200. This first polysilicon layer is then patterned to a form bit line 207 that is coupled to the source/drain region 204, using photolithographic and etching processes. Subsequently, a second insulating layer 208 is deposited over the substrate 200. Then, using a mask, the second insulating layer 208 is patterned and etched into a layer that covers only the bit line 207 while wholly exposing the source/drain region 205.

Referring to FIG. 2B, a thin impurities-doped first polysilicon layer 209 is formed over the substrate and the second insulating layer 208, connecting to the source/drain region 205. Later, a photoresist layer 210 is coated over the first polysilicon layer 209, then patterned with a mask and etched to form a via 211. Thereafter, oxide material is deposited into the via 211 forming an oxide layer 212.

Referring to FIG. 2C, the photoresist layer 210 is removed. Then, a thin impurities-doped second polysilicon layer 213 is formed.

Referring to FIG. 2D, a portion of the second polysilicon layer 213 located over the top of the oxide layer 212 is removed exposing the oxide layer 212. Then, the oxide layer 212 within the remaining second polysilicon layer 213 is also removed to form the storage electrode of the capacitor, which is electrically coupled to the source/drain region 204 as well. Subsequently, a dielectric layer is formed over the surface of the storage electrode, and then an impurities-doped third polysilicon layer is formed over the dielectric layer to form the plate electrode. Finally, after performing the subsequent processing operations such as the formation of a metallic contact and a protective insulating layer, the DRAM capacitor structure is complete.

FIG. 3 is a cross-sectional view of a conventional stacked-type DRAM capacitor structure First, a semiconductor substrate 30 having a metallic oxide semiconductor (MOS) transistor 32 already formed thereon is provided. The MOS transistor includes a gate terminal 33, source/drain regions 34 and spacers 35. On top of the substrate 30, there is a field oxide layer 36 and a conductive layer 313. Next, insulating material is deposited over the substrate to form an insulating layer 38, and then the insulating layer 38 is etched to form contact windows at designated locations above the source/drain regions 34. Thereafter, a lower electrode 39, a dielectric layer 310 and an upper electrode 311 are sequentially formed above the contact windows to form a stacked capacitor structure 312. The dielectric layer 310 can be a silicon nitride/silicon dioxide (NO) composite layer or a silicon dioxide/silicon nitride/silicon dioxide (ONO) composite layer. Furthermore, the lower electrode 39 can have an undulating and non-planar profile. Finally, subsequent processing operations such as the formation of a metallic contact and protective insulating layer are performed to complete the DRAM capacitor structure.

At present, the conventional method of improving the storage capacity of a DRAM capacitor mainly relies on the manufacture of capacitor having all kinds of rough and uneven electrode surfaces. Although such method is capable of increasing the capacitance of a capacitor a little, it is insufficient to meet the demand for higher capacitance or to provide the capacitance for a miniaturized device. Besides, many complicated and repetitive processing steps are required for their fabrication.

In light of the foregoing, there is a need in the art to provide a better DRAM capacitor structure and method of manufacture.

SUMMARY OF THE INVENTION

Accordingly, the invention is directed to provide a method for forming a DRAM capacitor suitable for producing a miniaturized semiconductor device, and can effectively increase its capacitance through increasing the surface area of the capacitor.

To achieve these and other advantages and in accordance with the purpose of the invention, as embodied and broadly described herein, the invention provides a method for forming a DRAM capacitor. The method comprises the steps of first forming a transistor above a substrate. The transistor includes gate terminal and source/drain regions. Next, a first oxide layer is formed above the substrate, and then the first oxide layer is patterned with a mask followed by a first etching operation to form a first opening exposing the source/drain region. Thereafter, an impurities-doped first polysilicon layer and a tungsten silicide layer are sequentially formed over the first opening.

Then, the first polysilicon layer and the tungsten silicide layer are patterned with a mask, and a second etching operation is performed to expose a portion of the first oxide layer. A second oxide layer is formed by atmospheric pressure chemical vapor deposition (APCVD) on the first oxide layer. A first borophosphosilicate glass is formed on the second oxide layer and is etched back. The borophosphosilicate glass and the second oxide layer are partially removed to form a second opening. A second polysilicon layer is formed on the borophosphosilicate glass and the second opening. The second polysilicon is patterned with a mask and partially removed to form a shallow opening.

Then, an oxide layer is formed on the structure described above and etched back to form a spacer on the sides of the shallow opening. The second polysilicon layer is etched by using a first state and a second state on the machine tool TCP9400. A wet etching operation is performed using a buffered oxide etchant or a hydrofluoric acid solution to form a lower electrode having a cylinder profile. Finally, a dielectric layer is formed on the lower electrode. An upper electrode is formed on the dielectric layer to complete the construction of the capacitor.

The invention achieves the above-identified objects by providing a new method for manufacturing a DRAM capacitor. The method comprises the steps of first forming a transistor above a substrate. The transistor includes a gate terminal and source/drain regions. A silicon dioxide layer is formed on the substrate.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1:
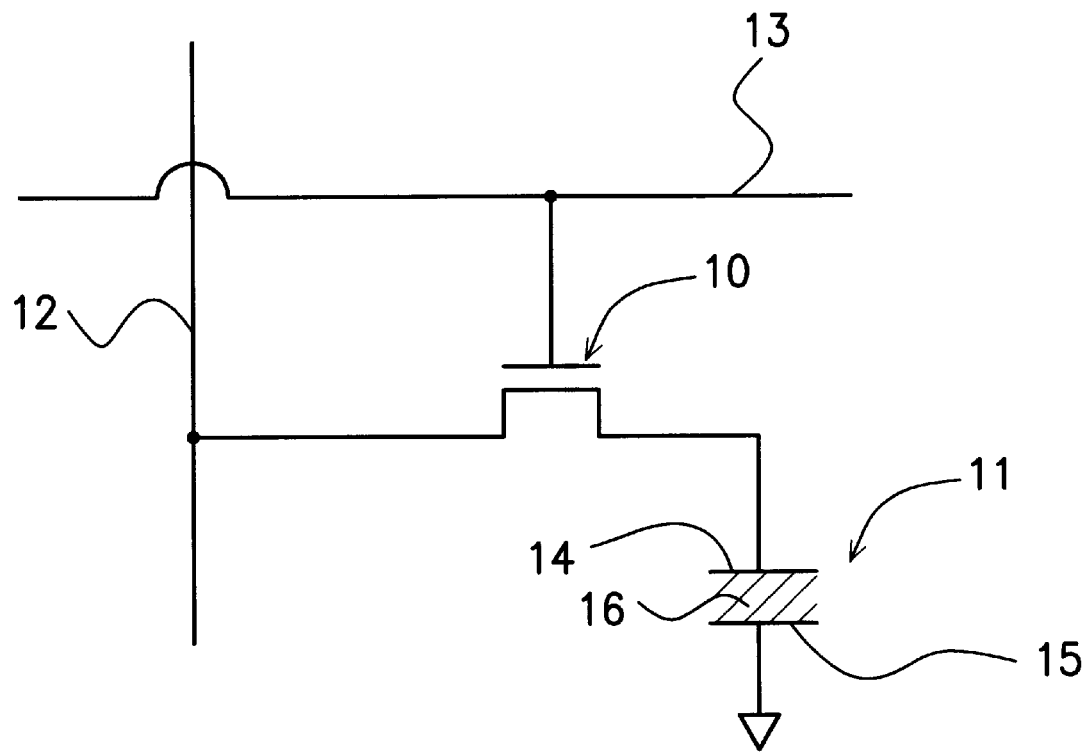
FIG. 1 is a circuit diagram showing a DRAM memory cell.
Figure 2A:
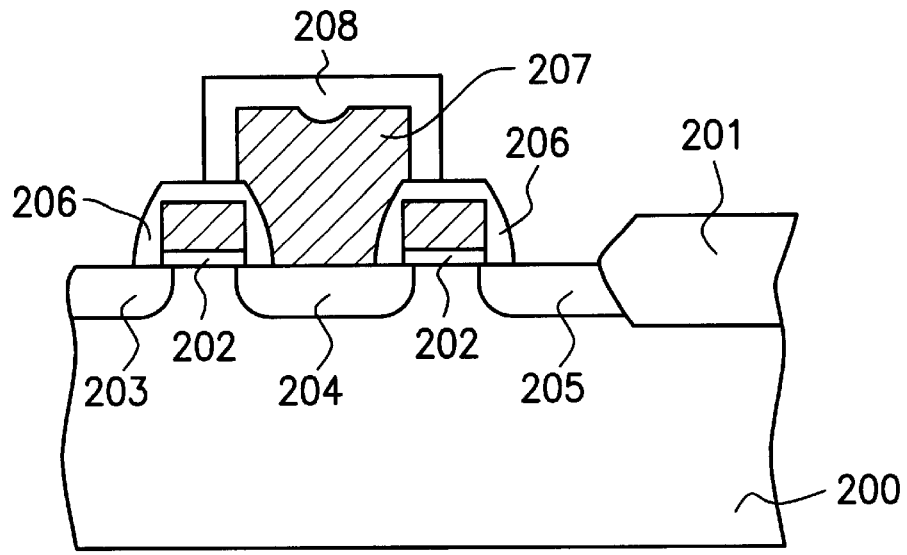
FIG. 2A–2D are cross-sectional views showing the progression of manufacturing steps in the fabrication of a trench-type DRAM capacitor according to a conventional method.
Figure 2B:
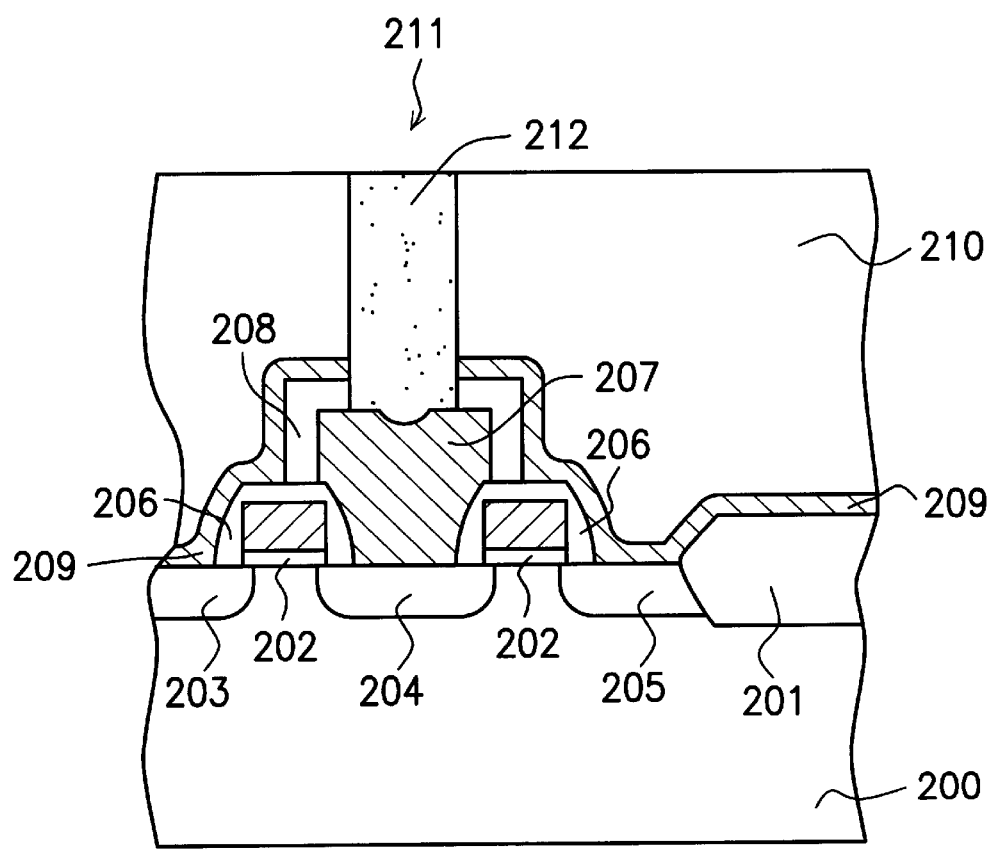
Figure 2C:
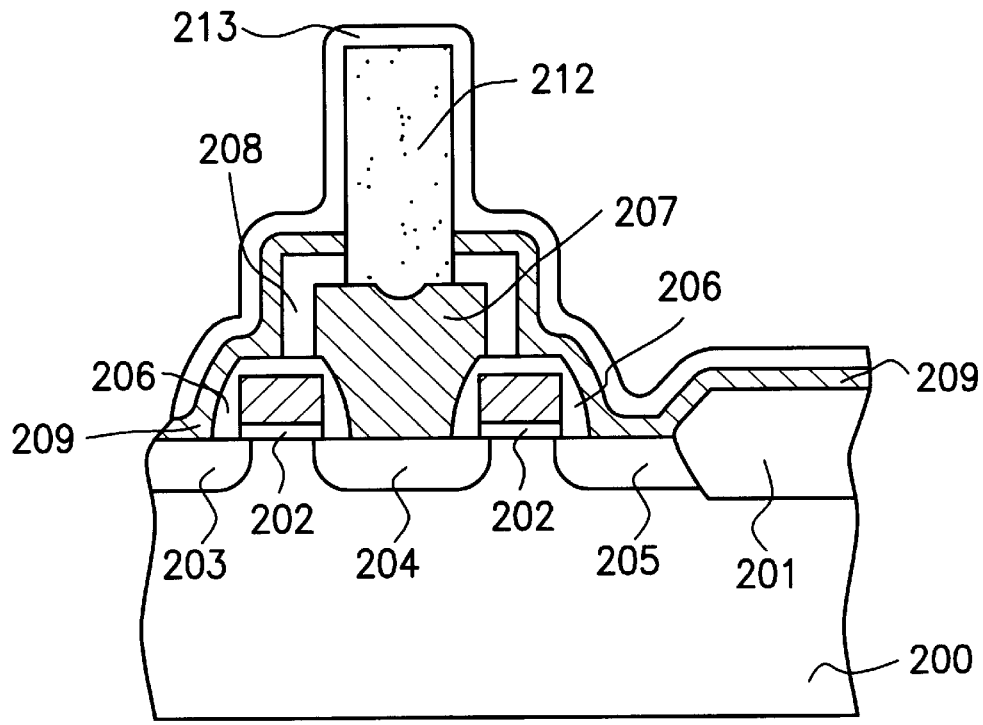
Figure 2D:
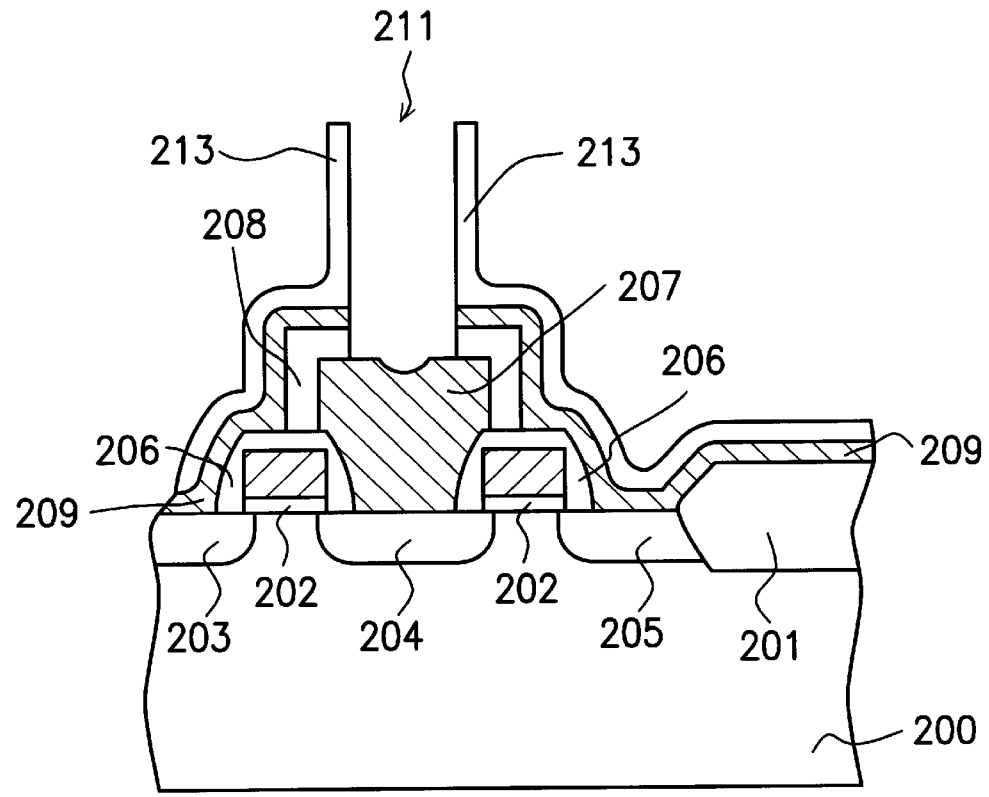
Figure 3:
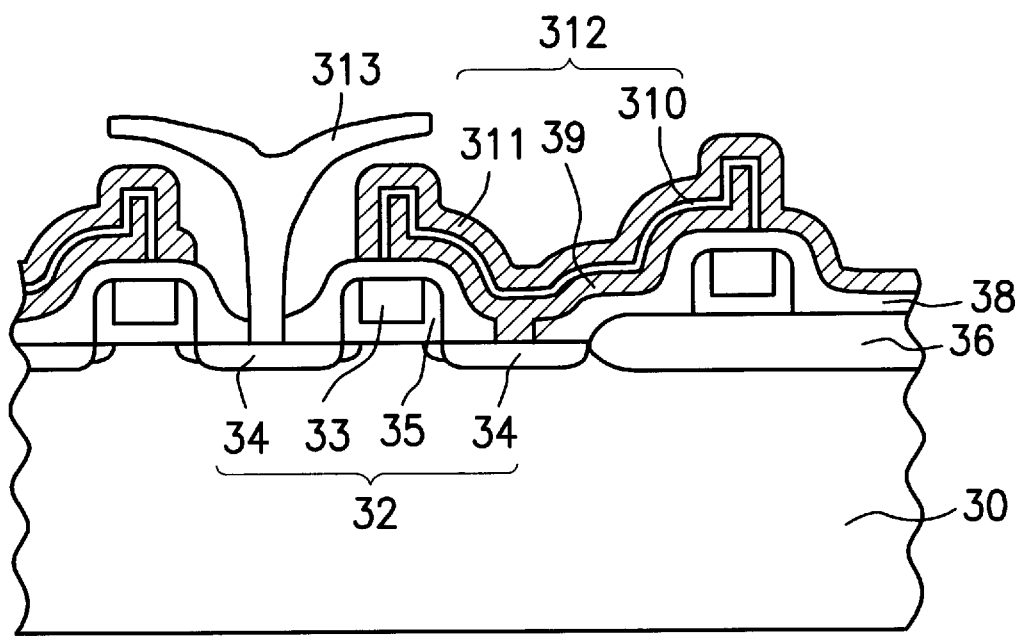
FIG. 3 is a cross-sectional view of a conventional stacked-type DRAM capacitor structure.
Figure 4A:
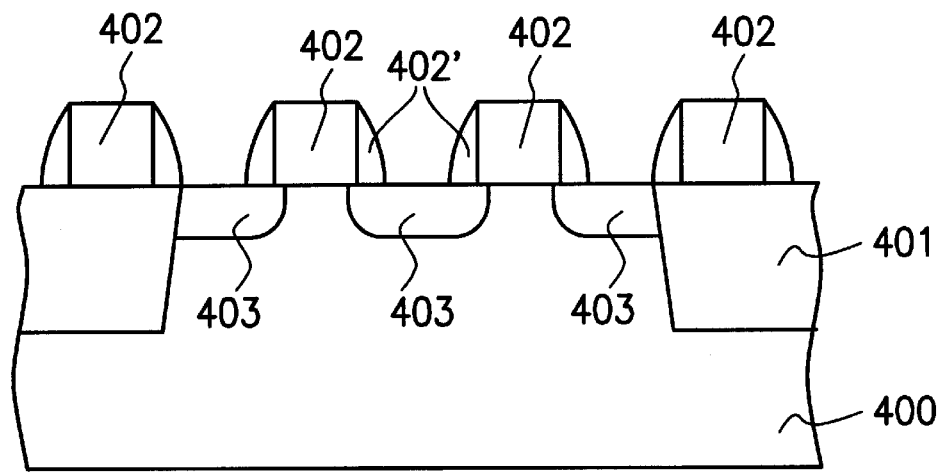
FIGS. 4A–4I are cross-sectional views showing the process steps of one preferred embodiment of the method for manufacturing a DRAM capacitor.
Figure 4B:
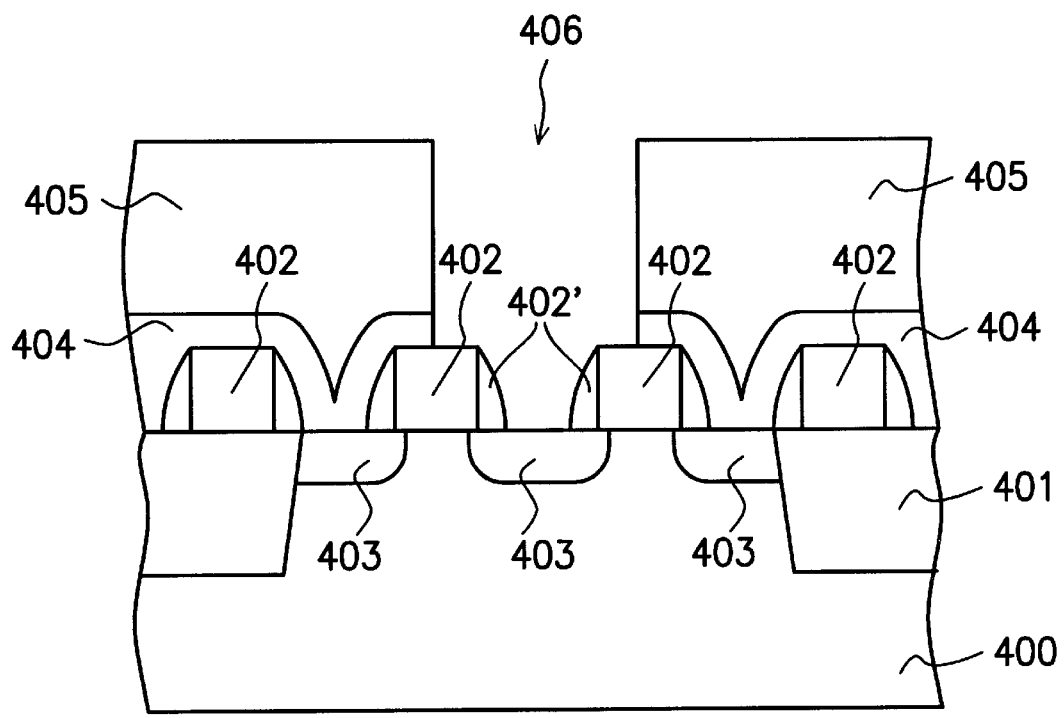

Referring first to FIG. 4A, a semiconductor substrate 400 having field oxide layers or shallow trench isolation structures and a MOS transistor already formed thereon is provided. The MOS transistor comprises a gate terminal 402 and a source/drain region 403, and the gate terminal 402 has a silicon nitride spacer 402' on its sidewalls. Referring to FIG. 4B, a first oxide layer 404 with a thickness of about 1000–2000 Å is formed on the gate terminal 402 and the source/drain region 403. Then, a first photoresist layer 405 is formed on the first oxide layer 404 and patterned with a mask. The first oxide layer 404 is partially removed to form a first opening 406, and the source/drain region 403 is exposed.

Figure 4C:
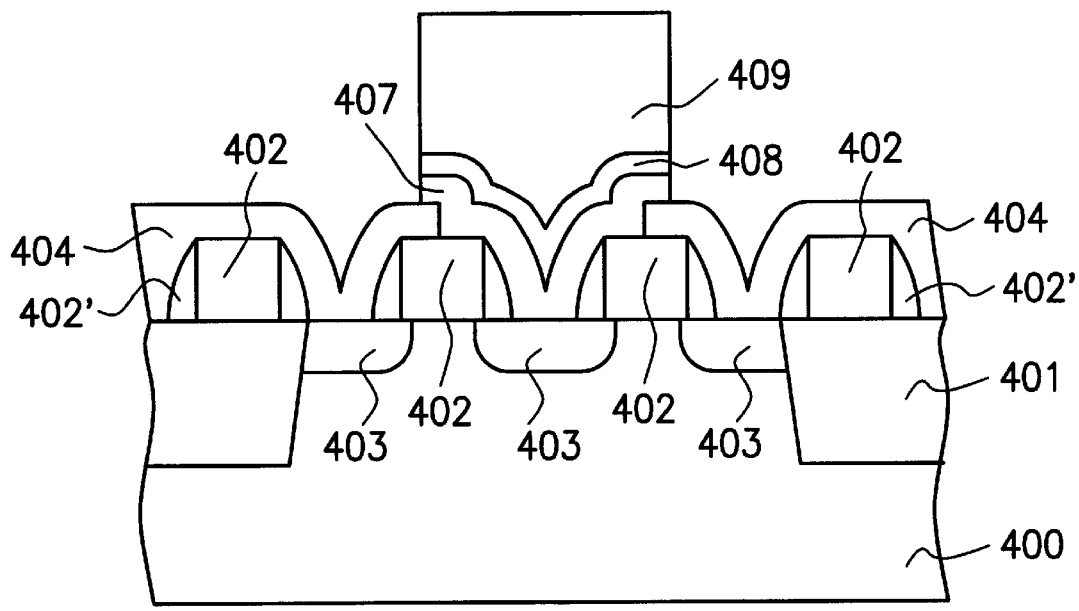

Referring to FIG. 4C, the first photoresist layer 405 is removed. A first polysilicon layer 407 and a tungsten silicide layer 408 are sequentially formed on the first oxide layer 404 and the first opening 406. The polysilicon layer 407 has a thickness of about 1000 Å and the tungsten silicide layer 408 has a thickness of about 1000 Å. A second photoresist layer 409 is formed on the tungsten silicide layer 408 and patterned with a mask. The first polysilicon layer 407 and the tungsten silicide layer 408 are partially removed to expose the first oxide layer 404.

Figure 4D:
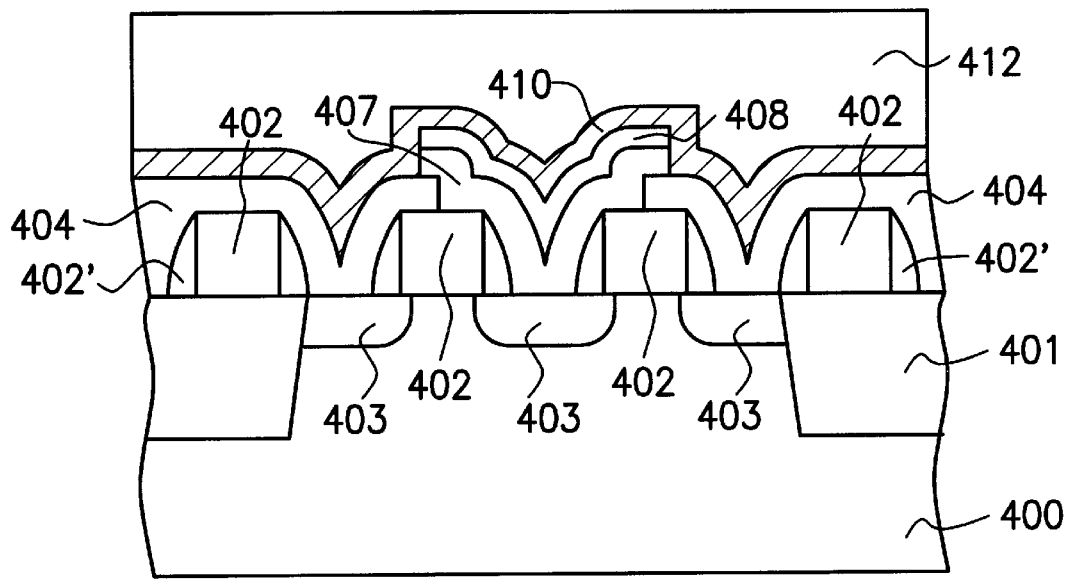

Referring to FIG. 4D, the second photoresist layer 409 is removed. A second oxide layer 410 and a borophosphosilicate glass layer 412 are formed on the structure shown in FIG. 4C. The second oxide layer 410 is formed, for example, by using APCVD and has a thickness of about 2000 Å. The borophosphosilicate glass layer 412 having a thickness of about 5000 Å is formed, for example, by a heat-flow operation at about 800° C.

Figure 4E:
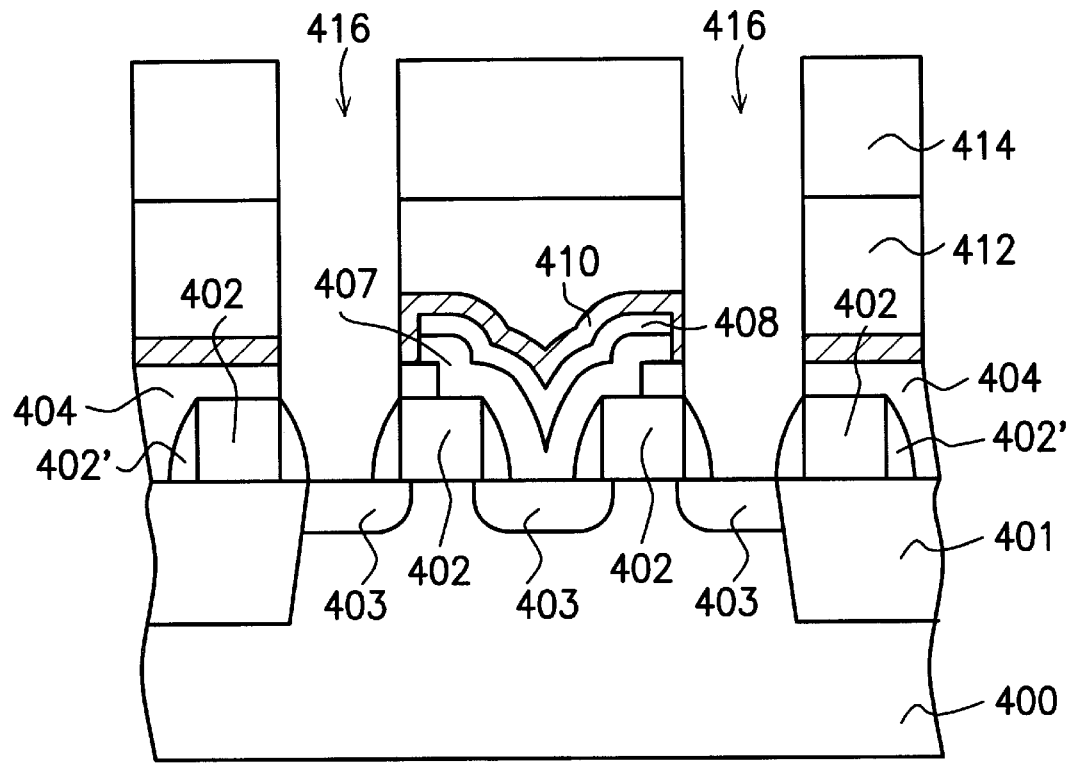

Referring to FIG. 4E, a third photoresist layer 414 is provided on the borophosphosilicate glass layer 412 and patterned with a mask to form a second opening 416 to expose the source/drain region 403.

Figure 4F:
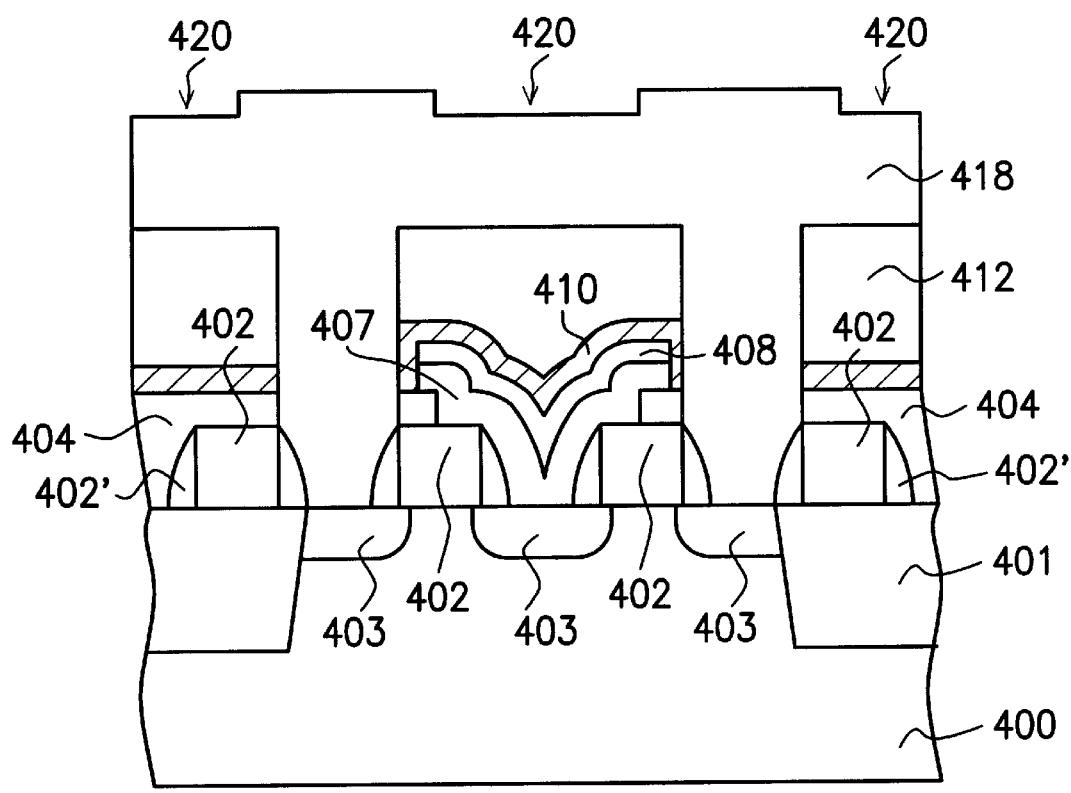

Referring to FIG. 4F, a second polysilicon layer 418 is formed on the structure described above after removing the third photoresist layer 414, and patterned to formed a shallow opening 420 on the second polysilicon layer 418. A shallow opening 420 is formed at a position corresponding to the borophosphosilicate glass layer 412, and the second polysilicon layer 418 above the second opening is not removed.

Figure 4G:
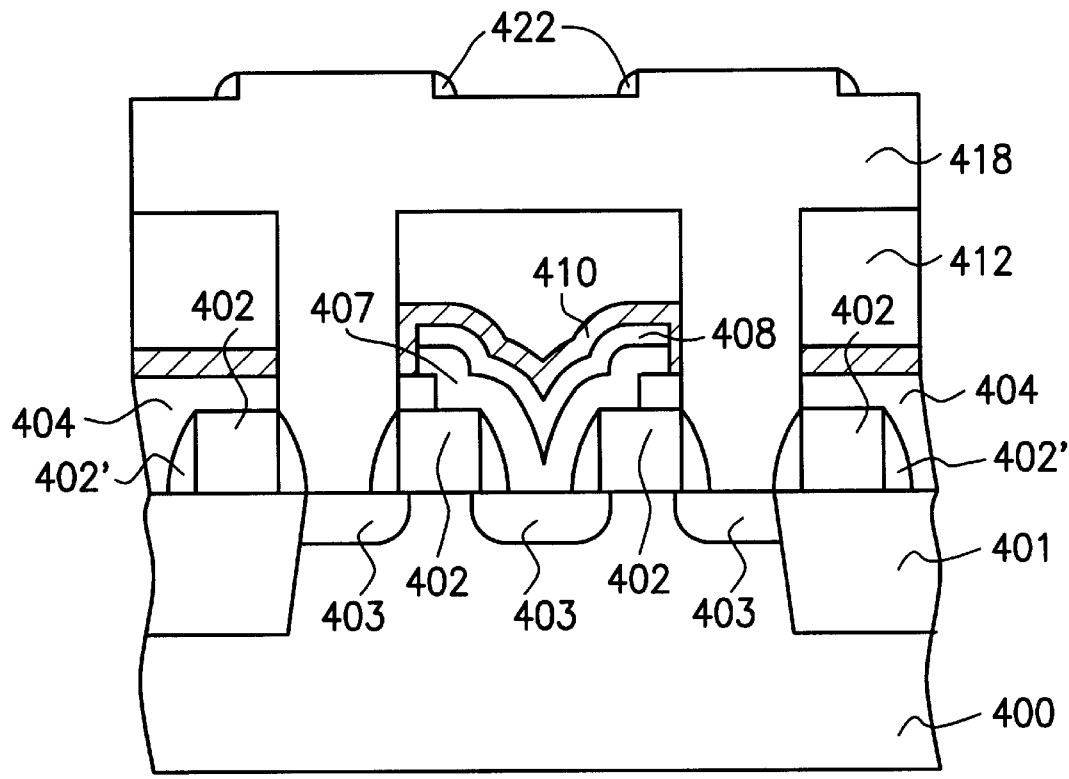

Referring to FIG. 4G, a third oxide layer (not shown) is formed on the second polysilicon layer 418 and etched back to form a spacer 422 on the side-wall of the shallow opening 420.

Figure 4H:
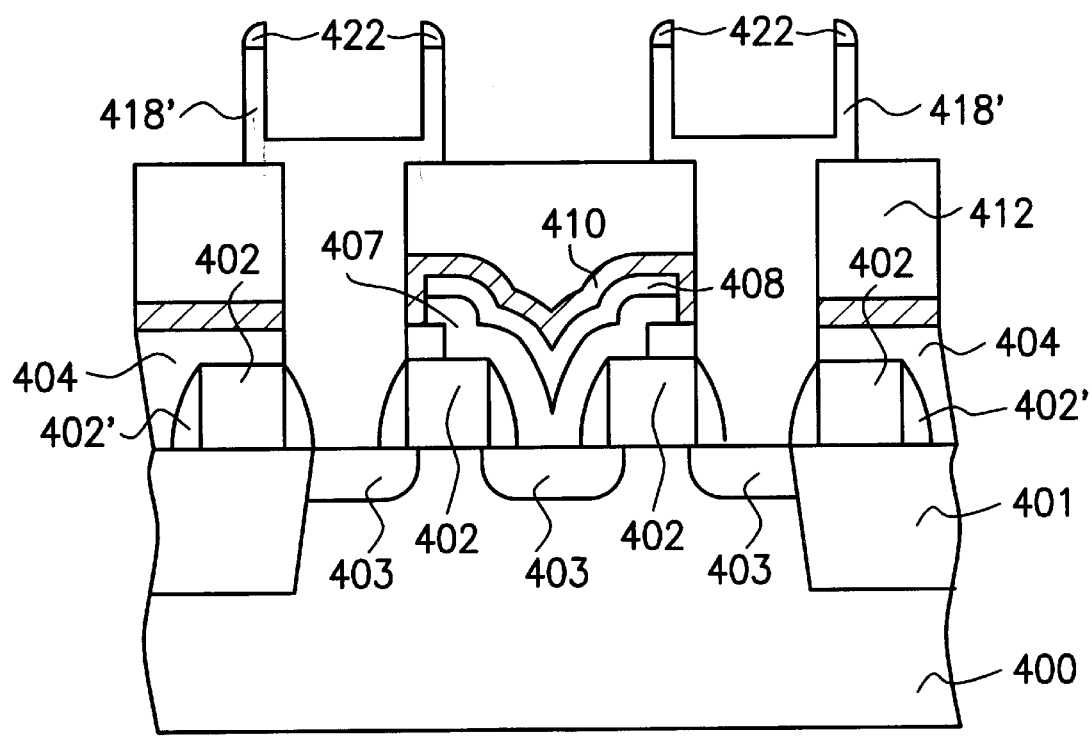

Referring to FIG. 4H, a two-stage etching operation is performed to etch the second polysilicon layer 418 by using the spacer 422 as a mask. Various recipes used in the etching step create a loading effect of the chemical etchant. The loading effect means that etching in an open area is easier than in a dense area. The etching rates are different. It allows the required depth to be achieved in the open area and the dense area at different times. It therefore uses a two-stage etching operation, performed by the machine tool TCP 9400. The first stage is performed for about 60 seconds with a pressure of about 20 mTorr, a machine power about 550 W, a bias voltage of about −80, HBr with a flow rate of about 60 sccm, and He-$O_2$ with a flow rate of about 30 sccm. The second stage is performed at 30° C. for about 240 seconds with a pressure of about 20 mTorr, a machine power of about 450 W, a bias voltage of about −80, HBr with a flow rate of about 160 sccm, $Cl_2$ with a flow rate of about 30 sccm, and He-$O_2$ with a flow rate of about 10 sccm.

Figure 4I:
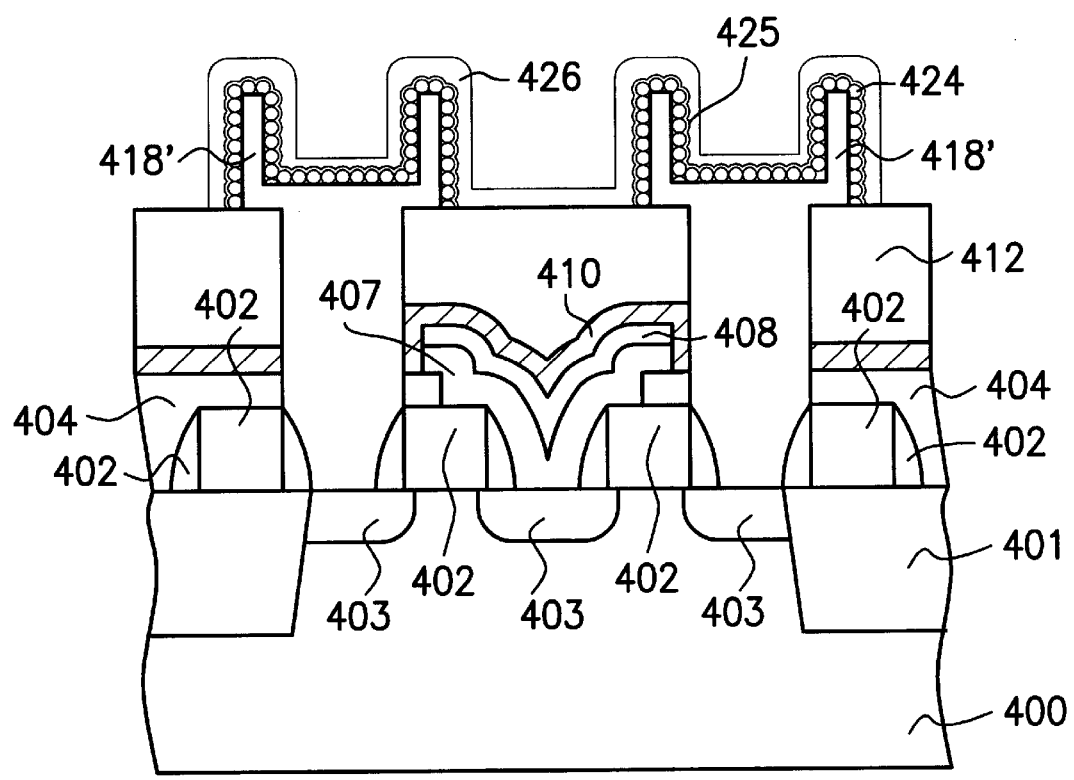

Referring to FIG. 4I, a wet etching operation is performed to removed the spacer 422, for example, by using a buffered oxide etchant whose concentration is 20:1 for about 120 seconds or using a hydrofluoric acid solution whose concentration is 100:1 for about 300 seconds. The wet etching operation forms a lower electrode 418' with a cylindrical profile. Then, a dielectric thin film is formed (not shown) on the lower electrode 418'. The dielectric thin film can be a silicon dioxide/silicon nitride (ONO) composite layer having a thickness preferably of about 50–60 Å. A hemispherical grain layer 424 is formed on the lower electrode 418' before forming the dielectric thin film 425 to increase the surface of the lower electrode 418'. An upper electrode 426, for example, a third polysilicon layer is deposited on the dielectric thin film with a thickness of about 500–1000 Å.

Since the loading effect makes the etching rates different, the etching step in the dense area requires a long time to achieve the needed depth. This causes over-etching in the open area. The over-etching may cleave the second polysilicon layer serving as the lower electrode 418'.

The invention uses the stages described above to form a capacitor. It not only forms a cylindrical capacitor with a larger surface by using an easier process, but also provides the best etching results in that the part of the second polysilicon layer between two capacitors is completely etched and the other parts of the second polysilicon layer, such as the lower electrode, aren't cleaved.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for manufacturing a DRAM capacitor, comprising the steps of:
    providing a semiconductor device which comprises a polysilicon layer;
    forming a lower electrode of the DRAM capacitor with a cylindrical profile by etching the polysilicon layer in a first stage of etching and a second stage of etching, wherein the first stage and the second stage have different etching rates, whereby the first stage and the second stage can be properly arranged to etch the polysilicon layer at a dense area and a loose area;
    forming a hemispherical grain layer on the lower electrode;
    forming a dielectric thin film on the hemispherical grain layer; and
    forming an upper electrode on the dielectric thin film.

2. A method according to claim 1, wherein the first stage is performed for about 60 seconds with a pressure of about 20 mTorr, a machine power of about 550 W, a bias voltage of about −80, HBr with a flow rate of about 60 sccm, and He-O$_2$ with a flow rate of about 30 sccm.

3. A method according to claim 1, wherein the second stage is performed at 30° C. for about 240 seconds with a pressure of about 20 mTorr, a machine power of about 450 W, a bias voltage of about −80, HBr with a flow rate of about 160 sccm, Cl$_2$ with a flow rate of about 30 sccm, and He-O$_2$ with a flow rate of about 10 sccm.

4. A method for manufacturing a DRAM capacitor, comprising the steps of:
    providing a semiconductor substrate which comprises a gate and a source/drain region;
    forming a first oxide layer on the gate and the source/drain region;
    partially removing the first oxide layer to form a first opening;
    sequentially forming a first polysilicon layer and a tungsten silicide layer on the first oxide layer;
    partially removing the first polysilicon layer and the tungsten silicide layer to expose the first oxide layer;
    forming a second oxide layer and a borophosphosilicate glass layer on the tungsten silicide layer and the exposed first oxide layer;
    forming a second opening to expose the source/drain region;
    forming a second polysilicon layer on the borophosphosilicate glass layer and the second opening;
    partially removing the second polysilicon layer to form a shallow opening;
    forming a spacer on the sidewalls of the shallow opening;
    etching the second polysilicon layer to form a lower electrode with a cylindrical profile by using the spacer as a mask and performing the process in a first stage and a second stage;
    forming a hemispherical grain layer on the lower electrode;
    forming a dielectric thin film on the hemispherical grain layer; and
    forming an upper electrode on the dielectric thin film.

5. A method according to claim 4, wherein the first stage is performed for 60 seconds with a pressure of about 20 mTorr, a machine power of about 550 W, a bias voltage of about −80, HBr with a flow rate of about 60 sccm, and He-O$_2$ with a flow rate of about 30 sccm.

6. A method according to claim 4, wherein the second stage is performed at 30° C. and for about 240 seconds with a pressure of about 20 mTorr, a machine power of about 450 W, a bias voltage of about −80, HBr with a flow rate of about 160 sccm, Cl$_2$ with a flow rate of about 30 sccm, and He-O$_2$ with a flow rate of about 10 sccm.

7. A method according to claim 4, wherein the first polysilicon layer has a thickness of about 1000 Å.

8. A method according to claim 4, wherein the tungsten silicide layer has a thickness of about 1000 Å.

9. A method according to claim 4, wherein the second oxide layer has a thickness of about 2000 Å.

10. A method according to claim 4, wherein the borophosphosilicate glass layer has a thickness of about 5000 Å.

11. A method for manufacturing a DRAM capacitor, comprising the steps of:
    providing a semiconductor substrate which comprises a gate and a source/drain region;
    forming a first oxide layer on the gate and the source/drain region;
    partially removing the first oxide layer to form a first opening;
    sequentially forming a first polysilicon layer and a tungsten silicide layer on the first oxide layer;
    partially removing the first polysilicon layer and the tungsten silicide layer to expose the first oxide layer;
    forming a second oxide layer and a borophosphosilicate glass layer on the tungsten silicide layer and the exposed first oxide layer;
    forming a second opening to expose the source/drain region;
    forming a second polysilicon layer on the borophosphosilicate glass layer and the second opening;
    partially removing the second polysilicon layer to form a shallow opening;

forming a spacer on the sidewalls of the shallow opening;

etching the second polysilicon layer by performing a first stage for about 60 seconds with a pressure of about 20 mTorr, a machine power of about 550 W, a bias voltage of about −80, HBr with a flow rate of about 60 sccm, and He-$O_2$ with a flow rate of about 30 sccm;

etching the second polysilicon layer by performing a second stage at 30° C. for about 240 seconds with a pressure of about 20 mTorr, a machine power of about 450 W, a bias voltage of about −80, HBr with a flow rate of about 160 sccm, $Cl_2$ with a flow rate of about 30 sccm, and He-$O_2$ with a flow rate about 10 sccm to form a lower electrode with a cylindrical profile;

forming a hemispherical grain layer on the lower electrode;

forming a dielectric thin film on the hemispherical grain layer; and forming an upper electrode on the dielectric thin film.

* * * * *